(12) United States Patent  
Park et al.

(10) Patent No.: US 9,030,091 B2
(45) Date of Patent: May 12, 2015

(54) SUBSTRATE FOR ORGANIC ELECTRONIC DEVICE

(71) Applicant: LG Chem, Ltd., Seoul (KR)

(72) Inventors: Min Choon Park, Daejeon (KR); Se Hwan Son, Daejeon (KR); Yeon Keun Lee, Daejeon (KR); Yong Sik Ahn, Seoul (KR); Jung doo Kim, Daejeon (KR); Ji Hee Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 14/056,600

(22) Filed: Oct. 17, 2013

(65) Prior Publication Data

US 2014/0042415 A1   Feb. 13, 2014

Related U.S. Application Data

(63) Continuation of application No. PCT/KR2013/002705, filed on Apr. 1, 2013.

(30) Foreign Application Priority Data

Mar. 30, 2012  (KR) .......... 10-2012-0033513
Jul. 31, 2012  (KR) .......... 10-2012-0084217

(51) Int. Cl.
*H01L 51/50*    (2006.01)
*H01L 51/52*    (2006.01)
*H01L 51/00*    (2006.01)
*H05B 33/22*    (2006.01)

(52) U.S. Cl.
CPC ........ *H01L 51/5275* (2013.01); *H01L 51/5268* (2013.01); *H01L 51/0096* (2013.01); *H05B 33/22* (2013.01); *H01L 2251/5369* (2013.01); *Y02E 10/549* (2013.01)

(58) Field of Classification Search
CPC ...................................... H01L 51/50
USPC .................................. 313/503, 504
See application file for complete search history.

(56) References Cited

U.S. PATENT DOCUMENTS

2005/0142379 A1*   6/2005   Juni et al. ............. 428/690

FOREIGN PATENT DOCUMENTS

| JP | 2007-335253 | 12/2007 |
|----|-------------|---------|
| JP | 2010-231155 | 10/2010 |
| JP | 2011-148668 | 8/2011 |
| KR | 10-2010-0063729 | 6/2010 |
| WO | 2011/126097 | 10/2011 |

* cited by examiner

*Primary Examiner* — Mary Ellen Bowman

(74) *Attorney, Agent, or Firm* — McKenna Long & Aldridge, LLP

(57) ABSTRACT

Provided are a substrate for an organic electronic device (OED), an OED, and lighting. The substrate capable of forming an OED ensuring excellent performance and reliability because it has excellent performance including light extraction efficiency, penetration of moisture or a gas from an external environment is inhibited, and growth of dark spots is controlled may be provided.

17 Claims, 8 Drawing Sheets

100

102

101

SUBSTRATE FOR ORGANIC ELECTRONIC DEVICE

This application is a Continuation Bypass of International Application No. PCT/KR2013/002705, filed Apr. 1, 2013, which claims priority to and the benefit of Korean Patent Application Nos. 10-2012-0033513, filed on Mar. 30, 2012, and 10-2012-0084217, filed on Jul. 31, 2012, the disclosures of which are incorporated herein by reference in their entirety.

FIELD

The present application relates to a substrate for an organic electronic device (hereinafter, it may be referred to as an "OED").

BACKGROUND

An OED is a device exhibiting various functions through exchange of charges between an electrode layer and an organic material. The OED may be an organic light emitting device (OLED), an organic solar cell, an organic photo conductor (OPC), or an organic transistor.

The OLED, which is a representative OED, conventionally includes a substrate, a first electrode layer, an organic layer including an emitting layer and a second electrode layer, which are sequentially stacked.

In the structure known as a bottom emitting device, the first electrode layer may be a transparent electrode layer, and the second electrode layer may be a reflective electrode layer. In addition, in the structure known as a top emitting device, the first electrode layer may be a reflective electrode layer, and the second electrode layer may be a transparent electrode layer.

Electrons and holes are injected respectively by the two electrode layers, and the injected electrons and holes are recombined in the emitting layer, resulting in generating light. The light may be emitted to the substrate in the bottom emitting device, or to the second electrode layer in the top emitting device.

In the structure of the OLED, indium tin oxide (ITO) generally used as the transparent electrode layer, the organic layer, and the substrate, which is conventionally formed of glass, have refractive indexes of approximately 2.0, 1.8 and 1.5, respectively. In such a relationship of the refractive indices, for example, the light generated in the organic emitting layer in the bottom emitting device is trapped at an interface between the organic layer and the first electrode layer or in the substrate due to a total internal reflection phenomenon, and only a very small amount of light is emitted.

DESCRIPTION

Object

The present application is directed to providing a substrate for an OED, and an OED.

Solution

One aspect of the present application provides a substrate for an OED, including: a base layer and a highly refractive layer. The highly refractive layer may be formed, for example, on the base layer. FIG. 1 shows an illustrative substrate 100 including a base layer 101 and a highly refractive layer 102 formed thereon. The term "highly refractive layer" used herein may refer to a layer having a refractive index of approximately 1.8 to 2.5, 1.8 or 2.2, or 1.8 or 2.0. The term "refractive index" used herein may refer to, unless particularly defined otherwise, a refractive index with respect to light having a wavelength of approximately 550 or 633 nm. For example, the highly refractive layer may be a light scattering planarized layer. The term "light scattering planarized layer (hereinafter, simply referred to as a "planarized layer")" may refer to a layer which may provide a planarized surface on which an OED may be formed, and may scatter, diffuse or refract incident light. When the highly refractive layer is a planarized layer, the highly refractive layer may have a surface having a maximum height roughness of 1 or 0.5 μm or less, and scatter or diffuse incident light. The term "maximum height roughness" used herein may refer to a distance between a straight line passing the maximum point of the roughness curve and a straight line passing the minimum point thereof, which is parallel to a central line in a roughness curve within a cut off. The maximum height roughness may be, for example, a value measured with respect to an optional region having an area of 100 $\mu m^2$ on the planarized surface.

As the base layer, a suitable material may be used without particular limitation. For example, to manufacture a bottom emitting OLED, a transparent base layer, for example, a base layer having a transmittance of 50% or more with respect to light in a visible region may be used. As the transparent base layer, a glass base layer or a transparent polymer base layer may be used. As the glass base layer, a base layer including soda lime glass, barium/strontium-containing glass, lead glass, alumino silicate glass, borosilicate glass, barium borosilicate glass or quartz may be used, and as the polymer base layer, a base layer including polyimide (PI), polyethylene naphthalate (PEN), polycarbonate (PC), an acrylic resin, poly (ethylene terephthalate) (PET), poly(ether sulfide) (PES) or polysulfone (PS) may be used, but the present application is not limited thereto. In addition, as needed, the base layer may be a TFT substrate having a drive TFT.

For example, to provide a top emitting device using the substrate, the base layer does not need to be a transparent base layer. In this case, as needed, a reflective base layer having a reflective layer which is formed of aluminum on a surface of the base layer may be used.

The highly refractive layer may include, for example, scattering particles (hereinafter, referred to as "second particles") and highly refractive particles (hereinafter, referred to as "first particles"). For example, the highly refractive layer may be formed using a composition prepared by mixing the first and second particles with a binder. As described above, such a highly refractive layer may be a light scattering planarized layer providing a surface on which an OED including an electrode layer may be formed, and improving light extraction efficiency of the device due to a scattering function. In one example, the highly refractive layer may have a refractive index equal to or higher than that of an adjacent electrode layer, for example, which may be 1.8 or more. The refractive index of the highly refractive layer may be, for example, 3.5, 3.0, 2.5 or 2.0 or less.

The highly refractive layer may further include a binder maintaining the first and second particles. As the binder, a known material may be used without particular limitation. For example, various organic binders, inorganic binders or organic/inorganic binders known in the art may be used. In consideration of excellent thermal resistance or chemical resistance, a life span of the device, and excellent resistance to a high temperature process, a photolithography process or an etching process performed in the manufacturing process, an inorganic or organic/inorganic binder may be used, but when necessary, an organic binder may also be used. The binder may have, for example, a refractive index of approximately 1.4, 1.45, 1.5, 1.6, 1.65 or 1.7 or more. The upper limit of the refractive index of the binder may be selected in the range satisfying the refractive index of the highly refractive layer in consideration of the refractive index of the particles blended therewith. As the binder, for example, a heat or photo curable monomeric, oligomeric or polymeric organic material including polyimide, a caldo resin having a fluorine ring, urethane, epoxide, polyester or acrylate, an inorganic material such as silicon oxide, silicon nitride, silicon oxynitride or polysiloxane, or an organic/inorganic combination material may be used.

For example, as the binder, polysiloxane, poly(amic acid) or polyimide may be used. The polysiloxane may be prepared by polycondensating, for example, a condensable silane compound or siloxane oligomer, and such a binder may be formed in a matrix based on a bond (Si—O) between silicon and oxygen. During the formation of the binder, the binder matrix based on the bond (Si—O) between silicon and oxygen may be formed by controlling condensation conditions during the formation of the binder, or a matrix in which some of organic groups such as an alkyl group or condensable functional groups such as an alkoxy group remain may be formed.

As the poly(amic acid) or polyimide binder, for example, a binder having a refractive index of approximately 1.5, 1.6, 1.65 or 1.7 or more with respect to light having a wavelength of 550 or 633 nm may be used. The poly(amic acid) or polyimide may be prepared using, for example, a monomer to which a halogen atom other than fluorine, a sulfur atom or a phosphorus atom is introduced.

As the binder, for example, poly(amic acid) capable of enhancing dispersion stability of particles due to the presence of a part capable of binding with the particles such as a carboxylic acid may be used.

As the poly(amic acid), for example, a compound including a repeating unit of Formula 1 may be used.

a sulfur atom or a phosphorus atom such as a phenyl group, a benzyl group, a naphthyl group or a thiophenyl group may be used.

The poly(amic acid) may be a homopolymer formed only using the repeating unit of Formula 1, or a copolymer including another unit with the repeating unit of Formula 1. In the copolymer, the kind or ratio of another repeating unit may be suitably selected in the range in which, for example, a desired refractive index, thermal resistance or light transmittance is not inhibited.

As a specific example of the repeating unit of Formula 1, a repeating unit of Formula 2 may be used.

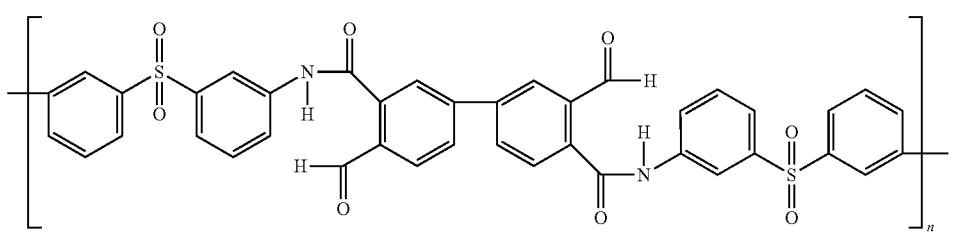

[Formula 2]

In Formula 2, n is a positive number.

The poly(amic acid) may have a weight average molecular weight converted by standard polystyrene measured by gel permeation chromatography (GPC) of approximately 10,000 to 100,000 or 10,000 to 50,000. The poly(amic acid) having the repeating unit of Formula 1 may also have light transmittance in a visible region of 80, 85, or 90% or more, and have excellent thermal resistance.

As the binder, a highly refractive binder or a lowly refractive binder may be used. The term "highly refractive binder" used herein may refer to a binder having a refractive index of approximately 1.7 to 2.5 or 1.7 to 2.0, and the term "lowly refractive binder" may refer to a binder having a refractive index of approximately 1.4 to less than 1.7. Various binders are known in the art, and a suitable one may be selected from the various kinds of binders or other binders known in the art to use.

The highly refractive layer may include highly refractive particles (first particles) along with the binder. The term "highly refractive particles" used herein may refer to particles, for example, having a refractive index of 1.5, 1.8, 2.0, 2.2, 2.5, 2.6, or 2.7 or more. The upper limit of the refractive index of the highly refractive particles may be selected in the

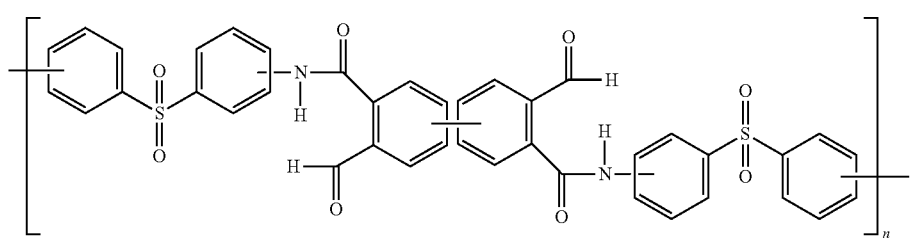

[Formula 1]

In Formula 1, n is a positive number.

The repeating unit may be optionally substituted with at least one substituent. As the substituent, a halogen atom other than fluorine, or a functional group including a halogen atom, range satisfying the refractive index of the highly refractive layer in consideration of the refractive index of the binder blended therewith. The highly refractive particles may have, for example, a smaller average diameter than that of scattering particles (second particles) to be described later. For example, the highly refractive particles may have an average diameter to such an extent that light may not be scattered. For example, the highly refractive particles may have an average diameter of approximately 100, 90, 80, 70, 60, 50, or 45 nm or less. In addition, the average diameter of the highly refractive particles (first particles) may be, for example, 1, 5, or 10 nm or more. As the highly refractive particles, alumina, alumino silicate, titanium oxide or zirconium oxide may be used. As the highly refractive particles, for example, particles having a refractive index of more than 2.3, or 2.4 or 2.5 or more, or approximately 2.5 to 3.0, a rutile-type titanium oxide may be used. When the rutile-type titanium oxide is used, although a content of the highly refractive particles in the material is relatively small, a highly refractive layer having a high refractive index may be embodied.

A ratio of the highly refractive particles (first particles) in the highly refractive layer is not particularly limited, and may be controlled within a range in which the above-described refractive index of the highly refractive layer may be ensured. In consideration of physical properties of the highly refractive layer, for example, a moisture or vapor penetrating ability of the highly refractive layer or outgassing, the highly refractive particles (first particles) may be included in the highly refractive layer at 300, 250, 200, 150 or 120 parts by weight or less with respect to 100 parts by weight of the binder. In addition, the ratio of the first particles may be, for example, 40, 60, 80, 90 or 100 parts by weight or more. The unit "parts by weight" used herein refers to, unless particularly defined otherwise, a weight ratio between components. As the ratios of the binder and the first particles are maintained as described above, for example, when the OED is formed, external quantum efficiency is increased, penetration of a gas or moisture from an external environment is prevented, and the outgassing is reduced, thereby providing the device having excellent performance and reliability.

The highly refractive layer may further include scattering particles (second particles). The term "scattering particles" used herein may refer to particles capable of scattering incident light since it has a different refractive index from a peripheral medium like the binder of the highly refractive layer or an electrode layer to be described later, and a suitable size. For example, particles having a refractive index, which is different from but higher than that of the binder, may be used as the scattering particles (second particles). For example, the scattering particles (second particles) may have a refractive index of approximately 2.0 to 3.5 or 2.2 to 3.0. Such scattering particles (second particles) may have a difference in refractive index with the binder of approximately more than 0.8. In addition, the difference in refractive index between the binder and the second particles may be, for example, approximately 1.5 or 1.0 or less. The scattering particles (second particles) may have an average diameter of, for example, approximately 100 nm or more, more than 100 nm, 100 to 20,000, 100 to 15,000, 100 to 10,000, 100 to 5,000, 100 to 1,000, or 100 to 500 nm. The scattering particles (second particles) may have a cyclic, oval, polygonal or amorphous shape, but the shape is not particularly limited. As the scattering particles (second particles), for example, particles including an organic material such as polystyrene or a derivative thereof, an acryl resin or a derivative thereof, a silicon resin or a derivative thereof, or a novolac resin or a derivative thereof, or an inorganic material such as silica, alumina, titanium oxide or zirconium oxide may be used. The scattering particles (second particles) may include any one of the above materials, or at least two thereof.

Such scattering particles (second particles) may be included in the highly refractive layer at 10 to 100 parts by weight with respect to 100 parts by weight of the binder, and ensure a suitable scattering property within the above ratio.

The highly refractive layer may be formed by a wet coating or sol-gel method using a coating solution including the binder, the scattering particles (second particles) and the highly refractive particles (first particles).

In the highly refractive layer, a ratio (A/B) of a weight (A) of the highly refractive particles (first particles) to a weight (B) of the scattering particles (second particles) may be, for example, approximately 0.9 to 8, 1 to 8, or 1 to 7.

In addition, in the highly refractive layer, a ratio ((A+B)/C) of a sum (A+B) of the weight (A) of the highly refractive particles (first particles) and the weight (B) of the scattering particles (second particles) to the weight (C) of the binder may be, for example, approximately 1 to 5, 1 to 4.5, 1 to 4, 1.2 to 4.0, 1.2 to 3.8, 1.2 to 3.6, 1.2 to 3.4, 1.2 to 3.2, or 1.2 to 3.0. Within such a range of the ratio, a scattering property and other required physical properties of the highly refractive layer may be excellently maintained.

The ratio between the binder, and the first and second particles may be changed, for example, in consideration of the refractive index of the binder used herein. For example, the highly refractive layer may include the lowly refractive binder, and in this case, a ratio ((A+B)/C) of the sum (A+B) of the weight (A) of the highly refractive particles (first particles) and the weight (B) of the scattering particles (second particles) to the weight (C) of the binder may be approximately 2 to 5. In addition, when the highly refractive layer includes the above-described highly refractive binder, the ((A+B)/C) of the sum (A+B) of the weight (A) of the highly refractive particles (first particles) and the weight (B) of the scattering particles (second particles) to the weight (C) of the binder may be 1 to 2 or equal to or more than 1 to less than 2. Within such a range of the ratio, the physical properties of the highly refractive layer, for example, a refractive index, durability, etc., may be maintained in a suitable level.

The substrate may further include an electrode layer. For example, the electrode layer may be formed on the top of the highly refractive layer. As the electrode layer, for example, a hole injection or electron injection electrode layer conventionally used to manufacture an OED such as an OLED may be formed.

The hole injection electrode layer may be formed, for example, using a material having a relatively high work function, and when necessary, using a transparent material. For example, the hole injection electrode layer may include a metal, an alloy, or an electric conductive compound, which has a work function of approximately 4.0 eV or more, or a mixture of at least two thereof. Such a material may be a metal such as gold, CuI, ITO, indium zinc oxide (IZO), zinc tin oxide (ZTO), aluminum or indium-doped zinc oxide, magnesium indium oxide, nickel tungsten oxide, an oxide material such as ZnO, $SnO_2$ or $In_2O_3$, a metal nitride such as gallium nitride, a metal selenide such as zinc selenide, or a metal sulfide such as zinc sulfide. A transparent hole injection electrode layer may also be formed using a stacked structure of a metal thin film such as Au, Ag or Cu and a highly refractive transparent material such as ZnS, $TiO_2$ or ITO.

The hole injection electrode layer may be formed by an arbitrary means such as deposition, sputtering, chemical deposition or an electrochemical means. In addition, as needed, the formed electrode layer may be patterned through a known process such as photolithography or a shadow mask. A thickness of the hole injection electrode layer may vary depending on light transmittance or surface resistance, and may be conventionally within a range of 500 nm or 10 to 200 nm.

An electron injection transparent electrode layer may be formed, for example, using a transparent material having a relatively low work function, or for example, may be formed using a suitable material of the materials used to form the hole injection electrode layer, but the present application is not limited thereto. The electron injection electrode layer may also be formed using, for example, deposition or sputtering, or may be suitably patterned when necessary. The electron injection electrode layer may be formed to a suitable thickness as needed.

When the electrode layer is formed, the highly refractive layer may have a smaller projected area than that of the electrode layer. In this case, the highly refractive layer may have a smaller projected area than that of the base layer. The term "projected area" used herein refers to an area of projecting a target recognized when the substrate is observed from above or below in a direction parallel to a normal line of a surface of the substrate, for example, an area of the base layer, the highly refractive layer or the electrode layer. Accordingly, for example, although a substantial surface area is larger than that of the electrode layer because a surface of the highly refractive layer is formed in an uneven shape, when an area recognized by observing the highly refractive layer from above is smaller than that recognized by observing the electrode layer from above, it is construed that the highly refractive layer has a smaller projected area than that of the electrode layer.

The highly refractive layer may be present in various types when it has a smaller projected area than those of the base layer and the electrode layer. For example, as shown in FIG. 2, the highly refractive layer 102 may be formed only at a part of the base layer 101 other than an edge thereof, or a part of the highly refractive layer may remain at the edge of the base layer.

FIG. 3 is a diagram of the substrate of FIG. 2 when observed from above. As shown in FIG. 2, an area (A), that is, a projected area (A), of the electrode layer 501 recognized when the substrate is observed from above is larger than an area (B), that is, a projected area (B) of the highly refractive layer 102 laying below. A ratio (A/B) of the projected area (A) of the electrode layer 501 and the area (B), that is, the projected area (B) of the highly refractive layer 102 may be, for example, 1.04, 1.06, 1.08, 1.1, or 1.15 or more. When the projected area of the highly refractive layer is smaller than that of the electrode layer, since an optical functional layer to be described later is possibly embodied not to be exposed to an external environment, the upper limit of the ratio (A/B) in projected area is not particularly limited. In consideration of an environment for manufacturing a general substrate, the upper limit of the ratio (A/B) may be, for example, approximately 2.0, 1.5, 1.4, 1.3 or 1.25. In the substrate, the electrode layer may be formed on the top of the base layer on which the highly refractive layer is not formed. The electrode layer may be formed in contact with the base layer, or an additional component may be further included between the electrode layer and the base layer. According to such a structure, in the embodiment of the OED, a structure in which the highly refractive layer is not exposed to an external environment may be embodied.

For example, as shown in FIG. 3, the electrode layer 501 may be formed in a region including a region beyond all of peripheral regions of the highly refractive layer 102 when observed from above. In this case, for example, when a plurality of highly refractive layers are present on the base layer, the electrode layer may be formed up to the region including the region beyond all of the peripheral regions of at least one highly refractive layer, for example, the highly refractive layer at least on the top of which an organic layer will be formed. In such a structure, a structure in which the highly refractive layer is not exposed to an external environment may be formed by attaching an encapsulating structure to be described later to an electrode layer below which the highly refractive layer is not formed. Accordingly, penetration of external moisture or oxygen through the highly refractive layer may be prevented, an adhesive strength between the encapsulating structure or an electrode and the substrate may be stably ensured, and a surface hardness at the edge of the device may be excellently maintained.

The substrate may further include, for example, an intermediate layer present between the highly refractive layer and the electrode layer. The intermediate layer may have a larger projected area than that of the highly refractive layer, and may be formed on the top of the highly refractive layer and the top of the base layer on which the highly refractive layer is not formed. The intermediate layer may solve an increase in resistance of the electrode layer by reducing a step difference on the boundary between the electrode layer on the highly refractive layer and the electrode layer on the base layer, which is formed by the highly refractive layer having a smaller projected area than that of the electrode layer as described above. In addition, as the intermediate layer, when a material having a barrier property, that is, a material having a low penetrating rate of moisture or vapor is used, a structure in which the highly refractive layer is not exposed to an external environment may be more effectively embodied. The intermediate layer may be a layer having an absolute value of a difference in refractive index between the intermediate layer and the electrode layer of, for example, approximately 1, 0.7, 0.5, or 0.3 or less. When the refractive index is controlled, for example, degradation of light extraction efficiency may be prevented by trapping light generated on the top of the electrode layer at an interface between the electrode layer and the intermediate layer. A material for forming the intermediate layer may be a material having a relationship of the refractive index with the electrode layer, and a barrier property when necessary. As such a material, various materials, for example, titanium oxide (TiOx) such as SiON or $TiO_2$, silicon oxide (SiOx) such as $SiO_2$, aluminum oxide (AlOx) such as $Al_2O_3$, another metal oxide such as $Ta_2O_3$, $Ti_3O_3$, TiO, $ZrO_2$, $Nb_2O_3$, $CeO_2$, ZnS or ZnO or oxynitride may be used. The intermediate layer may be formed by a known deposition method such as PVD, CVD or ALD, a sputtering method or a wet coating method. A thickness of the intermediate layer may be, but is not particularly limited to, for example, approximately 1 to 100, 10 to 100 or 20 to 80 nm. The thickness means an average thickness, and for example, the intermediate layer formed on the intermediate layer formed on the highly refractive layer and the base layer may have different thicknesses.

Another aspect of the present application provides an OED. The illustrative OED may include the substrate for an OED and an OED formed on the substrate, for example, a highly refractive layer of the substrate. For example, the OED may include a first electrode layer, an organic layer and a second electrode layer, which are sequentially formed on the highly refractive layer. In one embodiment, the OED may be an OLED. When the OED is an OLED, the OED may have, for example, a structure in which an organic layer including at least an emitting layer is intermediated between a hole injection electrode layer and an electron injection electrode layer. The hole injection electrode layer or the electron injection electrode layer may be an electrode layer on the highly refractive layer of the substrate described above.

In the OLED, the organic layer present between the electron and hole injection electrode layers may include at least one emitting layer. The organic layer may include multiple, that is, at least two emitting layers. When the at least two emitting layers are included, the emitting layers may have a structure split by an inter-electrode having a charge generating characteristic or a charge generating layer (CGL), but the present application is not limited thereto.

The emitting layer may be formed using, for example, various fluorescent or phosphorescent organic materials known in the art. An example of the material capable of being in the emitting layer may be, but is not limited to, a fluorescent material such as an Alq-based material such as tris(4-methyl-8-quinolinolate)aluminum(III) (Alg3), 4-MAlq3 or Gaq3; a cyclopentadiene derivative such as C-545T ($C_{26}H_{26}N_2O_2S$), DSA-amine, TBSA, BTP, PAP-NPA, spiro-FPA, $Ph_3Si$ (PhT-DAOXD), 1,2,3,4,5-pentaphenyl-1,3-cyclopentadiene (PPCP), 4,4'-bis(2,2'-diphenylvinyl)-1,1'-biphenyl (DPVBi), distyryl benzene or a derivative thereof, or 4-(dicyanomethylene)-2-tert-butyl-6-(1,1,7,7,-tetramethyljulolidyl-9-enyl)-4H-pyran (DCJTB), DDP, AAAP or NPAMLI; or a phosphorescent material such as Firpic, m-Firpic, N-Firpic, $bon_2Ir$ (acac), $(C_6)_2Ir(acac)$, $bt_2Ir(acac)$, $dp_2Ir(acac)$, $bzq_2Ir(acac)$, $bo_2Ir(acac)$, $F_2Ir(bpy)$, $F_2Ir(acac)$, $op_2Ir(acac)$, $ppy_2Ir(acac)$, $tpy_2Ir(acac)$, fac-tris[2-(4,5'-difluorophenyl)pyridine-C'2,N] iridium(III) (FIrppy) or bis(2-(2'-benzo[4,5-a]thienyl)pyridinato-N,C3') iridium(acetylactonate) ($Btp_2Ir(acac)$). The emitting layer may include the material as a host, and a host-dopant system including perylene, distyrylbiphenyl, DPT, quinacridone, rubrene, BTX, ABTX or DCJTB as a dopant.

The emitting layer may also be formed by employing one suitable type selected from electron accepting organic compounds and electron donating organic compounds exhibiting excellent emitting characteristics, which will be described later.

The organic layer may be formed in various structures further including various functional layers known in the art, as long as it includes the emitting layer. As a layer capable of being included in the organic layer, an electron injection layer, a hole blocking layer, an electron transport layer, a hole transport layer or a hole injection layer may be used.

The electron injection layer or electron transport layer may be formed using, for example, an electron accepting organic compound. Here, as the electron accepting organic compound, a known optional compound may be used without particular limitation. As such an organic compound, a polycyclic compound such as p-terphenyl or quaterphenyl or a derivative thereof; a polycyclic hydrocarbon compound such as naphthalene, tetracene, pyrene, coronene, chrysene, anthracene, diphenylanthracene, naphthacene, or phenanthrene or a derivative thereof; or a heterocyclic compound such as phenanthroline, bathophenanthroline, phenanthridine, acridine, quinoline, quinoxaline, or phenazine or a derivative thereof. In addition, fluoroceine, perylene, phthaloperylene, naphthaloperylene, perynone, phthaloperynone, naphthaloperynone, diphenylbutadiene, tetraphenylbutadiene, oxadiazole, aldazine, bisbenzoxazoline, bisstyryl, pyrazine, cyclopentadiene, oxine, aminoquinoline, imine, diphenylethylene, vinylanthracene, diaminocarbazole, pyrane, thiopyrane, polymethine, merocyanine, quinacridone, rubrene or a derivative thereof, a metal chelate complex compound disclosed in a patent publication such as Japanese Patent Application Laid-Open No. 1988-295695, Japanese Patent Application Laid-Open No. 1996-22557, Japanese Patent Application Laid-Open No. 1996-81472, Japanese Patent Application Laid-Open No. 1993-009470 or Japanese Patent Application Laid-Open No. 1993-017764, for example, a metal complex having at least one of metal chelated oxinoid compounds such as 8-quinolatos including tris(8-quinolinolato)aluminum, bis(8-quinolinolato)magnesium, bis[benzo(f)-8-quinolinolato]zinc, bis(2-methyl-8-quinolinolato)aluminum, tris(8-quinolinolato)indium, tris(5-methyl-8-quinolinolato)aluminum, 8-quinolinolatolithium, tris(5-chloro-8-quinolinolato)gallium, bis(5-chloro-8-quinolinolato)calcium and derivatives thereof as a coordinator; an oxadiazole compound disclosed in a patent publication such as Japanese Patent Application Laid-Open No. 1993-202011, Japanese Patent Application Laid-Open No. 1995-179394, Japanese Patent Application Laid-Open No. 1995-278124 or Japanese Patent Application Laid-Open No. 1995-228579; a triazine compound disclosed in a patent publication such as Japanese Patent Application Laid-Open No. 1995-157473; a stilbene derivative disclosed in a patent publication such as Japanese Patent Application Laid-Open No. 1994-203963; a distyrylarylene derivative; a styryl derivative disclosed in a patent publication such as Japanese Patent Application Laid-Open No. 1994-132080 or Japanese Patent Application Laid-Open No. 1994-88072, a diolefin derivative disclosed in a patent publication such as Japanese Patent Application Laid-Open No. 1994-100857 or Japanese Patent Application Laid-Open No. 1994-207170; a fluorescent brightening agent such as a benzooxazole compound, a benzothiazole compound or a benzoimidazole compound; a distyrylbenzene compound such as 1,4-bis(2-methylstyryl)benzene, 1,4-bis(3-methylstyryl)benzene, 1,4-bis(4-methylstyryl)benzene, distyrylbenzene, 1,4-bis(2-ethylstyryl)benzyl, 1,4-bis(3-ethylstyryl)benzene, 1,4-bis(2-methylstyryl)-2-methylbenzene or 1,4-bis(2-methylstyryl)-2-ethylbenzene; a distyrylpyrazine compound such as 2,5-bis(4-methylstyryl)pyrazine, 2,5-bis(4-ethylstyryl)pyrazine, 2,5-bis[2-(1-naphthyl)vinyl]pyrazine, 2,5-bis(4-methoxystyryl)pyrazine, 2,5-bis[2-(4-biphenyl)vinyl]pyrazine or 2,5-bis[2-(1-pyrenyl)vinyl]pyrazine; a dimethylidine compound such as 1,4-phenylenedimethylidene, 4,4'-phenylenedimethylidene, 2,5-xylene dimethylidene, 2,6-naphthylenedimethylidene, 1,4-biphenylenedimethylidene, 1,4-para-terephenylene dimethylidene, 9,10-anthracenediyldimethylidine, or 4,4'-(2,2-di-ti-butylphenylvinyl)biphenyl, 4,4'-(2,2-diphenylvinyl)biphenyl or a derivative thereof; a silanamine derivative disclosed in a patent publication such as Japanese Patent Application Laid-Open No. 1994-49079 or Japanese Patent Application Laid-Open No. 1994-293778; a multifunctional styryl compound disclosed in a patent publication such as Japanese Patent Application Laid-Open No. 1994-279322 or Japanese Patent Application Laid-Open No. 1994-279323; an oxadiazole derivative disclosed in a patent publication such as Japanese Patent Application Laid-Open No. 1994-107648 or Japanese Patent Application Laid-Open No. 1994-092947; an anthracene compound disclosed in a patent publication such as Japanese Patent Application Laid-Open No. 1994-206865; an oxinate derivative disclosed in a patent publication such as Japanese Patent Application Laid-Open No. 1994-145146; a tetraphenyl butadiene compound disclosed in a patent publication such as Japanese Patent Application Laid-Open No. 1992-96990; an organic trifunctional compound disclosed in a patent publication such as Japanese Patent Application Laid-Open No. 1991-296595; a coumarin derivative disclosed in a patent publication such as Japanese Patent Application Laid-Open No. 1990-191694; a perylene derivative disclosed in a patent publication such as Japanese Patent Application Laid-Open No. 1990-196885; a naphthalene derivative disclosed in a patent publication such as Japanese Patent Application Laid-Open No. 1990-255789; a phthaloperynone derivative disclosed in a patent publication such as Japanese Patent Application Laid-Open No. 1990-289676 or Japanese Patent Application Laid-Open No. 1990-88689; or a styryl amine derivative disclosed in a patent publication such as Japanese Patent Application Laid-Open No. 1990-250292 may be used as an electron accepting organic compound included in the lowly refractive layer. In addition, here, the electron injection layer may be formed using, for example, a material such as LiF or CsF.

The hole blocking layer may be a layer capable of enhancing a life span and efficiency of the device by preventing approach of holes injected from a hole injection electrode to an electron injection electrode through the emitting layer, and may be formed in a suitable part between the emitting layer and the electron injection electrode using a known material when necessary.

The hole injection layer or hole transport layer may include, for example, an electron donating organic compound. As the electron donating organic compound, N,N',N'-tetraphenyl-4,4'-diaminophenyl, N,N'-diphenyl-N,N'-di(3-methylphenyl)-4,4'-diaminobiphenyl, 2,2-bis(4-di-p-tollylaminophenyl)propane, N,N,N',N'-tetra-p-tollyl-4,4'-diaminobiphenyl, bis(4-di-p-tollylaminophenyl)phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino) quadriphenyl, 4-N,N-diphenylamino-(2-diphenylvinyl) benzene, 3-methoxy-4'-N,N-diphenylaminostyrylbenzene, N-phenylcarbazole, 1,1-bis(4-di-p-triaminophenyl)cyclohexane, 1,1-bis(4-di-p-triaminophenyl)-4-phenylcyclohexane, bis(4-dimethylamino-2-methylphenyl)phenylmethane, N,N,N-tri(p-tollyl)amine, 4-(di-p-tollylamino)-4'-[4-(di-p-tollylamino)styryl]stilbene, N,N,N',N'-tetraphenyl-4,4'-diaminobiphenyl N-phenylcarbazole, 4,4'-bis[N-(1-naphthyl)-N-phenyl-amino]biphenyl, 4,4''-bis[N-(1-naphthyl)-N-phenylamino]p-terphenyl, 4,4'-bis[N-(2-naphthyl)-N-phenylamino]biphenyl, 4,4'-bis[N-(3-acenaphthenyl)-N-phenylamino]biphenyl, 1,5-bis[N-(1-naphthyl)-N-phenylamino]naphthalene, 4,4'-bis[N-(9-anthryl)-N-phenylamino]biphenylphenylamino]biphenyl, 4,4''-bis[N-(1-anthryl)-N-phenylamino]-p-terphenyl, 4,4'-bis[N-(2-phenanthryl)-N-phenylamino]biphenyl, 4,4'-bis[N-(8-fluoranthenyl)-N-phenylamino]biphenyl, 4,4'-bis[N-(2-pyrenyl)-N-phenylamino]biphenyl, 4,4'-bis[N-(2-perylenyl)-N-phenylamino]biphenyl, 4,4'-bis[N-(1-coronenyl)-N-phenylamino]biphenyl, 2,6-bis(di-p-tollylamino)naphthalene, 2,6-bis[di-(1-naphthyl)amino] naphthalene, 2,6-bis[N-(1-naphthyl)-N-(2-naphthyl)amino] naphthalene, 4,4''-bis[N,N-di(2-naphthyl)amino]terphenyl, 4,4'-bis{N-phenyl-N-[4-(1-naphthyl)phenyl] amino}biphenyl, 4,4'-bis[N-phenyl-N-(2-pyrenyl)amino]biphenyl, 2,6-bis[N,N-di-(2-naphthyl)amino]fluorine or 4,4'-bis(N,N-di-p-tollylamino)terphenyl, or an aryl amine compound such as bis(N-1-naphthyl)(N-2-naphthyl)amine may be used, but the present application is not limited thereto.

The hole injection layer or hole transport layer may be formed by dispersing the organic compound in a polymer, or using a polymer derived from the organic compound. In addition, a π-conjugated polymer such as polyparaphenylenevinylene and a derivative thereof, a hole transport non-conjugated polymer such as poly(N-vinylcarbazole) or a σ-conjugated polymer of polysilane may also be used.

The hole injection layer may be formed using an electrically-conductive polymer such as a metal phthalocyanine such as copper phthalocyanine or a non-metal phthalocyanine, a carbon layer and polyaniline, or may be formed by reaction with a Lewis acid using the aryl amine compound as an oxidizing agent.

For example, the OLED may be formed in a type of (1) a hole injection electrode layer/an organic emitting layer/an electron injection electrode layer; (2) a hole injection electrode layer/a hole injection layer/an organic emitting layer/an electron injection electrode layer; (3) a hole injection electrode layer/an organic emitting layer/an electron injection layer/an electron injection electrode layer; (4) a hole injection electrode layer/a hole injection layer/an organic emitting layer/an electron injection layer/an electron injection electrode layer; (5) a hole injection electrode layer/an organic semiconductor layer/an organic emitting layer/an electron injection electrode layer; (6) a hole injection electrode layer/an organic semiconductor layer/an electron barrier layer/an organic emitting layer/an electron injection electrode layer; (7) a hole injection electrode layer/an organic semiconductor layer/an organic emitting layer/an adhesion-improving layer/an electron injection electrode layer; (8) a hole injection electrode layer/a hole injection layer/a hole transport layer/an organic emitting layer/an electron injection layer/an electron injection electrode layer; (9) a hole injection electrode layer/an insulating layer/an organic emitting layer/an insulating layer/an electron injection electrode layer; (10) a hole injection electrode layer/an inorganic semiconductor layer/an insulating layer/an organic emitting layer/an insulating layer/ an electron injection electrode layer; (11) a hole injection electrode layer/an organic semiconductor layer/an insulating layer/an organic emitting layer/an insulating layer/an electron injection electrode layer; (12) a hole injection electrode layer/an insulating layer/a hole injection layer/a hole transport layer/an organic emitting layer/an insulating layer/an electron injection electrode layer or (13) a hole injection electrode layer/an insulating layer/a hole injection layer/a hole transport layer/an organic emitting layer/an electron injection layer/an electron injection electrode layer, which are sequentially formed from the highly refractive layer of the substrate, and in some cases, the OLED may have an organic layer having a structure in which at least two emitting layers are split by an inter-electrode layer having a charge generating characteristic or CGL between a hole injection electrode layer and an electron injection electrode layer, but the present application is not limited thereto.

Various materials for forming a hole or electron injection electrode layer and an organic layer, for example, an emitting layer, an electron injection or transport layer, or a hole injection or transport layer and methods of forming the same are known in the art, and all of the above-described methods may be applied to manufacture the OED.

The OED may further include an encapsulating structure. The encapsulating structure may be a protective structure for preventing inflow of an external material such as moisture or oxygen to the organic layer of the OED. The encapsulating structure may be, for example, a can such as a glass can or metal can, or a film covering an entire surface of the organic layer.

FIG. 4 shows that an organic layer 701 and a second electrode layer 702 formed on a substrate including a base layer 101, a highly refractive layer 102 and a first electrode layer 501, which are sequentially formed, are protected by an encapsulating structure 703 formed in a can type such as a glass can or a metal can. For example, the encapsulating structure 703 of FIG. 4 may be attached by, for example, an adhesive. The encapsulating structure 703 may be adhered to, for example, the electrode layer 501 below which the highly refractive layer 102 is not present on the substrate. For example, as shown in FIG. 4, the encapsulating structure 703 may be attached to an end of the substrate by an adhesive.

According to such a method, a protecting effect by the encapsulating structure may be optimized.

The encapsulating structure may be, for example, a film coating entire surfaces of the organic layer and the second electrode layer. FIG. 5 shows a film-type encapsulating structure 703 covering the entire surfaces of the organic layer 701 and the second electrode layer 702. For example, as shown in FIG. 5, the film-type encapsulating structure 703 may cover the entire surfaces of the organic layer 701 and the second electrode layer 702, and have a structure in which the substrate including the base layer 101, the highly refractive layer 102 and the electrode layer 501 is adhered to a second substrate 801 laying above. For example, as the second substrate 801, a glass substrate, a metal substrate, a polymer film or a barrier layer may be used. The film-type encapsulating structure may be formed by, for example, coating a liquid material cured by heat or UV irradiation such as an epoxy resin and curing the liquid material, or laminating the substrate with the upper substrate using an adhesive sheet previously manufactured in a film type using the epoxy resin.

The encapsulating structure may include a water adsorbent or getter such as a metal oxide such as calcium oxide or beryllium oxide, a metal halide such as calcium oxide, or phosphorus pentoxide, when necessary. For example, the water adsorbent or getter may be included in the film-type encapsulating structure, or present at a predetermined position of a can-type encapsulating structure. The encapsulating structure may further include a barrier film or a conductive film.

As shown in FIG. 4 or 5, the encapsulating structure may be attached to, for example, the top of the first electrode layer 501 below which the highly refractive layer 102 is not formed. Accordingly, a sealing structure in which the highly refractive layer is not exposed to an external environment may be embodied. The sealing structure may refer to, for example, a state in which the entire surface of the highly refractive layer is not exposed to an external environment by being surrounded by the base layer, the electrode layer and/or the encapsulating structure, or by being surrounded by the sealing structure formed to include the base layer, the electrode layer and/or the encapsulating structure. The sealing structure may be formed to only include the base layer, the electrode layer and/or the encapsulating structure, or to include the base layer, the electrode layer, the encapsulating structure, and also another component, for example, an auxiliary electrode as long as the highly refractive layer is not exposed to an external environment. For example, in FIG. 4 or 5, another component may be present at a part in which the base layer 101 is in contact with the electrode layer 501 or a part in which the electrode layer 501 is in contact with the encapsulating structure 703, or another position. As another component, a low water absorbing organic, inorganic or organic/inorganic combination material, an insulating layer, or an auxiliary electrode may be used.

Still another aspect of the present application provides a use of the OED, for example, the OLED. The OLED may be effectively applied to a backlight of a liquid crystal display (LCD), lightings, sensors, printers, a light source of a copy machine, a light source for an automobile gauge, a signal light, a pilot lamp, a display device, a light source for a planar emitting device, a display, decorations or other kinds of lights. In one embodiment, the present application relates to a lighting device including the OLED. When the OLED is applied to the lighting device or for different uses, other components constituting the device or a method of constituting the device is not particularly limited, but all of optional materials or methods known in the related art may be employed as long as these are used in the OLED.

Effect

According to the present application, a substrate capable of forming an OED ensuring excellent performance and reliability since it has excellent performance including light extraction efficiency, penetration of moisture or a gas from an external environment is inhibited, and growth of dark spots is controlled can be provided.

Figure 1:
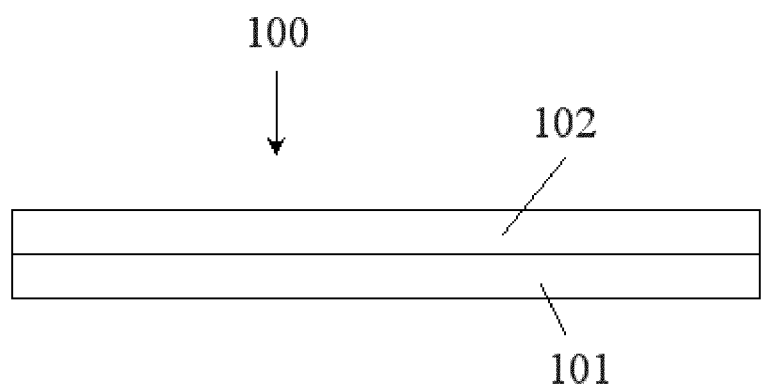
FIGS. 1 to 3 are schematic diagrams of an illustrative substrate.
Figure 2:
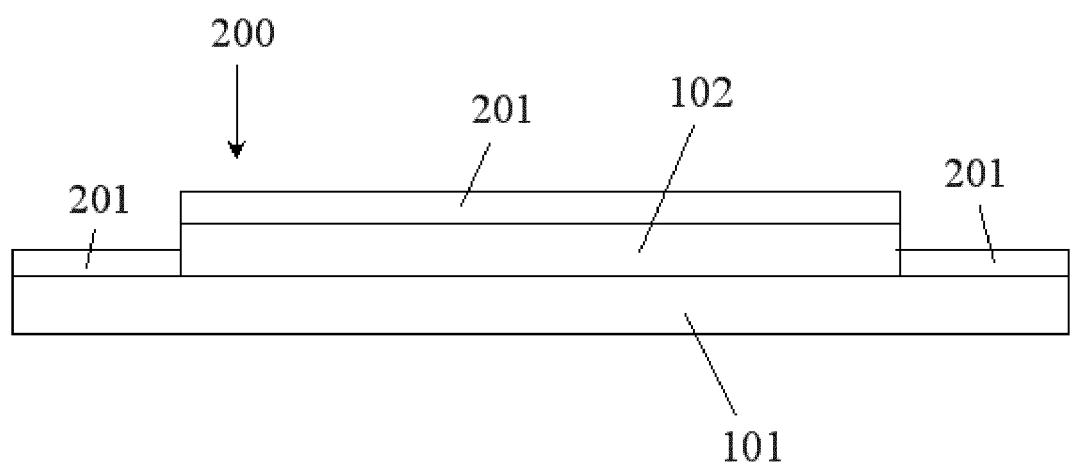
Figure 3:
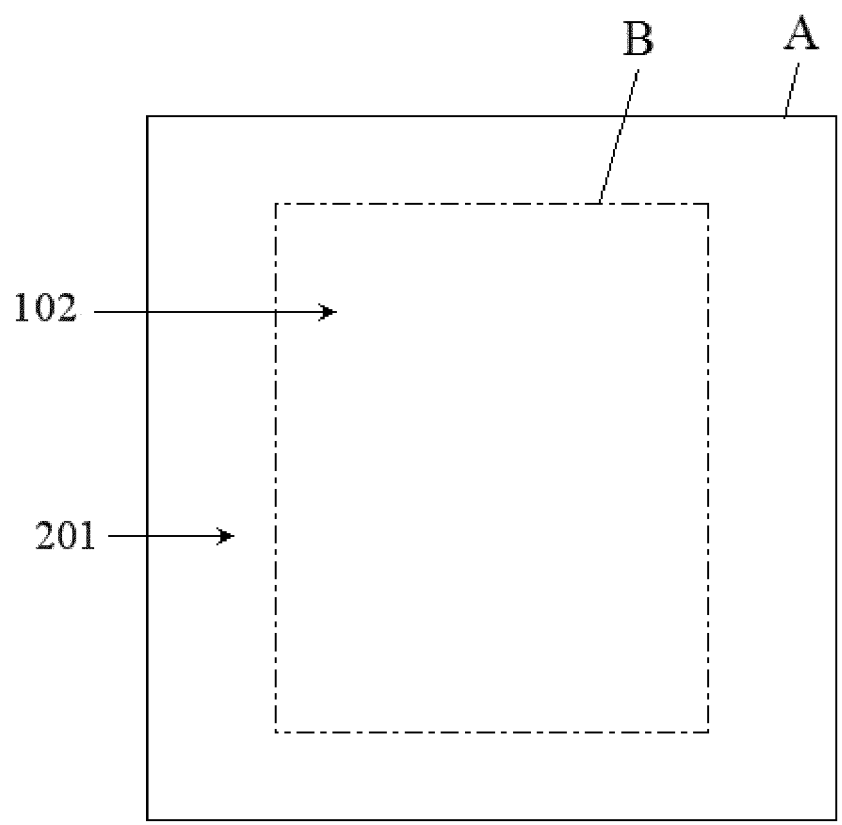
Figure 4:
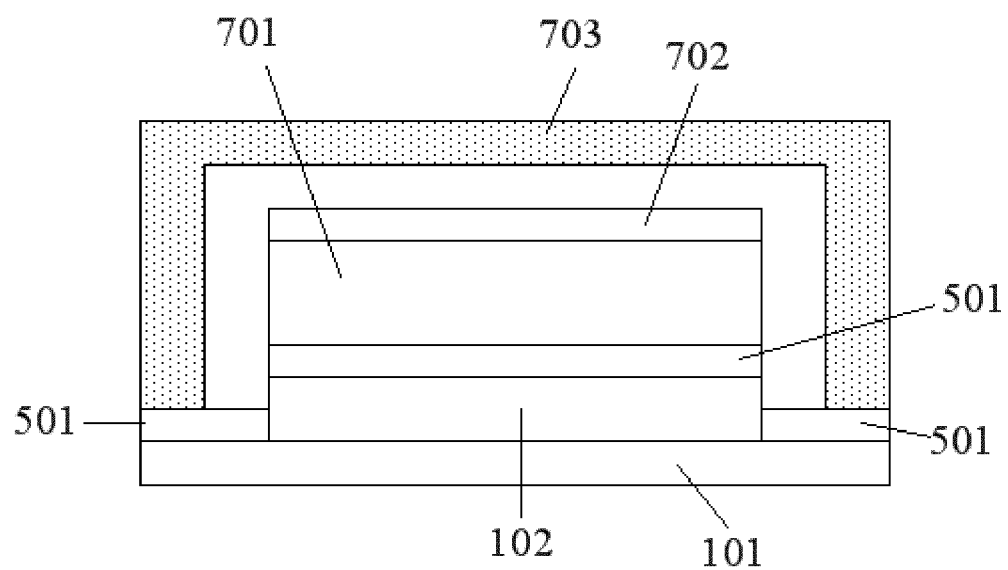
FIGS. 4 and 5 are diagrams of an illustrative OED.
Figure 5:
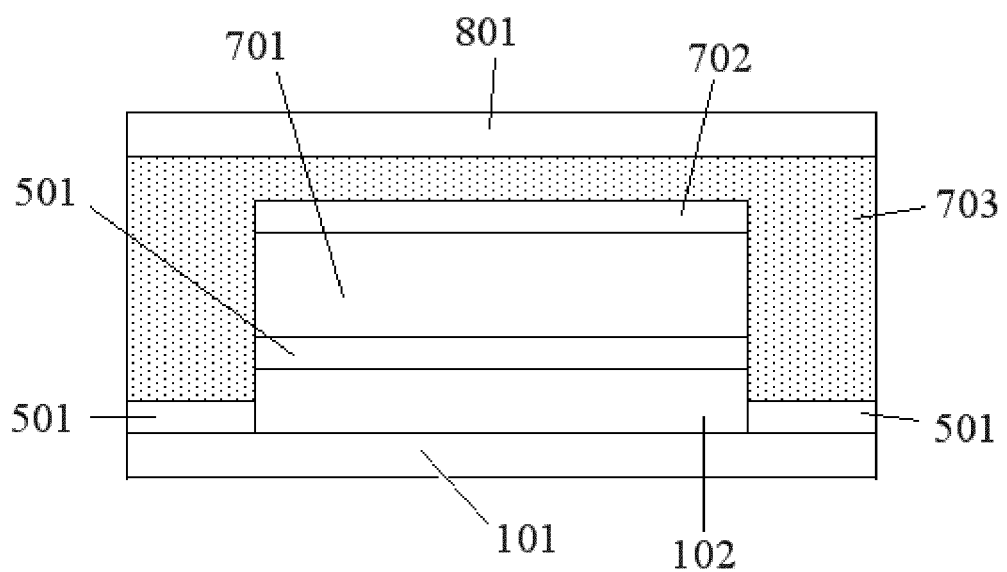

DESCRIPTION OF THE MARKS 100, 200: the substrate for the OED
101: the base layer
102: the high refractive layer
201: the electrode layer
501: the first electrode layer
701: the organic layer
702: the second electrode layer
703: the encapsulating structure
801: the second substrate Illustrative Embodiments Hereinafter, illustrative embodiments of the present application will be described in detail. However, the present application is not limited to the embodiments disclosed below.

EXAMPLE 1

As a binder, poly(amic acid) synthesized using a compound (3,3'-sulfonyldianiline) of Formula A and a compound (3,3',4,4'-bipheynyltetracarboxylic dianhydride) of Formula B by a known method of synthesizing poly(amic acid) and having a refractive index of approximately 1.7 to 1.8 was used, and a coating solution (binder:first particles:second particles=1:1.5:0.25 (weight ratio)) was prepared by blending scattering particles (titanium oxide particles; second particles) having an average diameter of approximately 200 nm and a refractive index of approximately 2.6) and highly refractive particles (rutile-type titanium oxide; first particles) having an average diameter of approximately 20 nm and a refractive index of approximately 2.6 with the binder. A highly refractive layer was formed by coating the prepared coating solution to a glass substrate. Afterward, a part of the highly refractive layer was removed by irradiating a laser to the formed layer to correspond a position of the remaining highly refractive layer to an emitting region of an organic layer to be subsequently formed. After the removal of the highly refractive layer, a hole injection electrode layer including ITO was formed to a predetermined thickness on an entire surface of the glass substrate by a known sputtering method. Subsequently, a device was manufactured by forming an organic layer capable of emitting white light on the ITO layer using known material and method, and forming an aluminum (Al) electrode as an electron injection reflective electrode on the top of the organic layer by a vacuum deposition method.

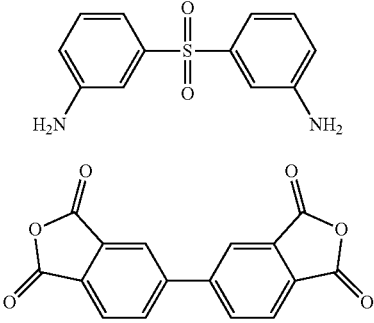

[Formula A]

[Formula B]

EXAMPLE 2

A device was manufactured as described in Example 1, except that a ratio of a binder, and first and second particles was changed in the preparation of a coating solution (ratio after changing=binder:first particles:second particles=1:1:0.8 (weight ratio)).

COMPARATIVE EXAMPLE 1

A device was manufactured as described in Example 1, except that a ratio of a binder, and first and second particles was changed in the preparation of a coating solution (ratio after changing=binder:first particles:second particles=1:1:1.4 (weight ratio)).

EXPERIMENTAL EXAMPLE 1

Evaluation of Reliability of Device

Figure 6:
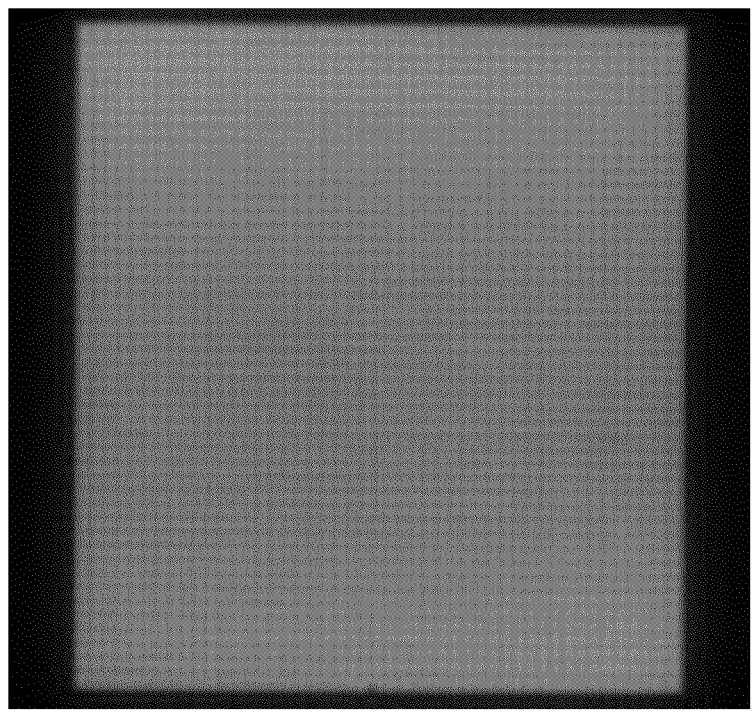
FIGS. 6 and 7 are diagrams showing emitting states according to Examples 1 and 2, respectively.
Figure 7:
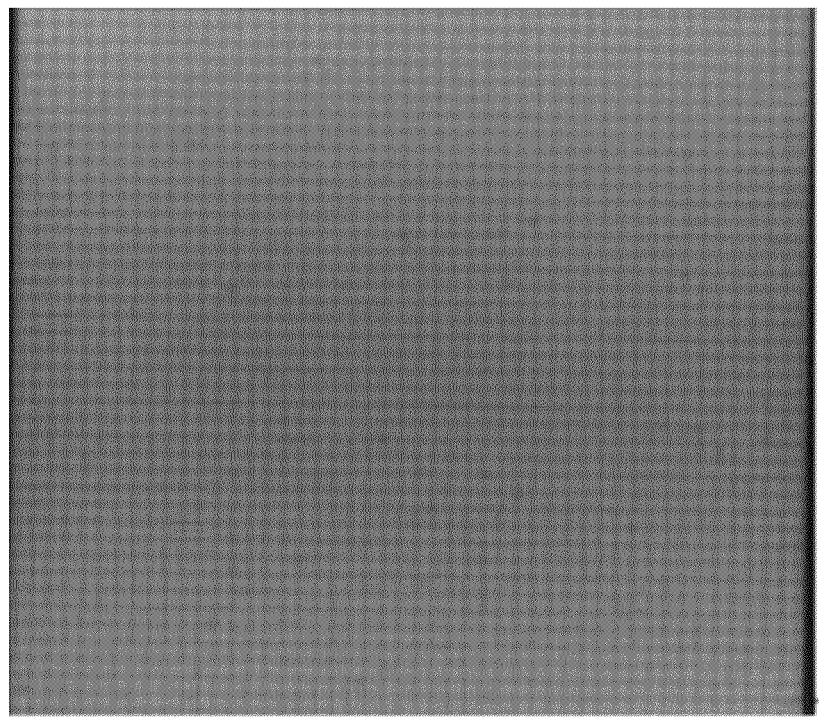
Figure 8:
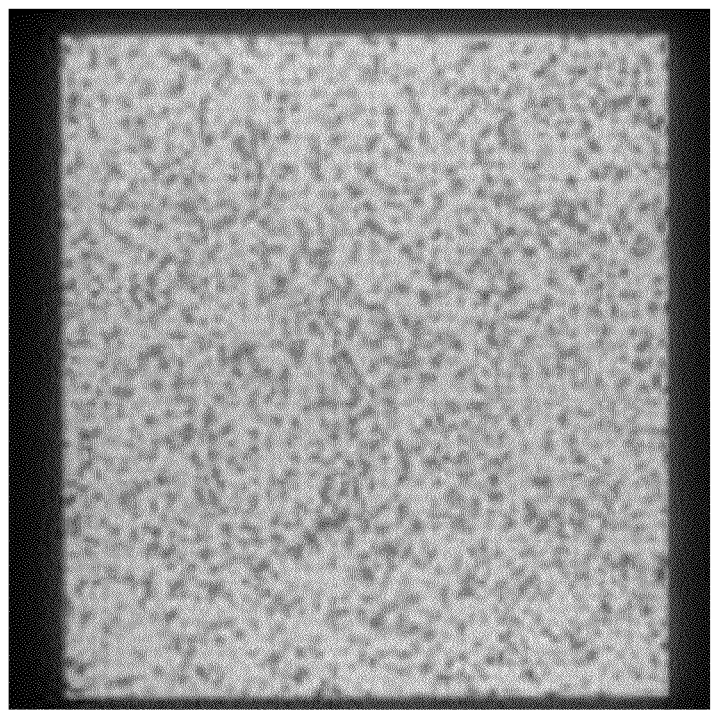
FIG. 8 is a diagram showing an emitting state according to Comparative Example 1.

FIGS. 6 and 7 are diagrams showing emitting states of the OEDs according to Examples 1 and 2, respectively, and FIG. 8 is a diagram showing an emitting state according to Comparative Example 1. It can be confirmed from FIGS. 6 to 8 that several dot spots were observed from the device according to Comparative Example 1, and thus the device exhibited a poor emitting state, but no dot spot was observed from the devices according to Examples 1 and 2, and thus a the devices were maintained in stable emitting state.

What is claimed is:

1. A substrate for an organic electronic device, comprising:
a base layer; and
a high refractive layer, of which a refractive index is 1.8 or more, which comprises a first particle, of which a refractive index is 1.8 or more and an average diameter is 50 nm or less, and a second particle, of which a refractive index is from 2.0 to 3.5 and an average diameter is 100 nm or more, and in which a ratio (A/B) of a weight (A) of the first particle and a weight (B) of the second particle is from 0.9 to 8.

2. The substrate according to claim 1, wherein a maximum height roughness of a surface of the high refractive layer is 1 μm or less.

3. The substrate according to claim 1, wherein the high refractive layer is in contact with the base layer.

4. The substrate according to claim 1, wherein the first particle has a refractive index of 2.2 or more.

5. The substrate according to claim 1, wherein the ratio (A/B) of the weight (A) of the first particle and the weight (B) of the second particle is from 1 to 8.

6. The substrate according to claim 1, wherein the high refractive layer further comprises a binder, and wherein a ratio ((A+B)/C) of a sum of the weight (A) of the first particle and the weight (B) of the second particle relative to a weight (C) of the binder is from 1 to 5.

7. The substrate according to claim 6, wherein the binder is polysiloxane, poly(amic acid) or polyimide.

8. The substrate according to claim 1, wherein the high refractive layer further comprises a binder, of which a refractive index is 1.4 or more and also less than 1.7.

9. The substrate according to claim 8, wherein a ratio ((A+B)/C) of a sum of the weight (A) of the first particle and the weight (B) of the second particle relative to a weight (C) of the binder, of which the refractive index is 1.4 or more and also less than 1.7, is from 2 to 5.

10. The substrate according to claim 1, wherein the high refractive layer further comprises a binder, of which a refractive index is 1.7 or more.

11. The substrate according to claim 10, wherein a ratio ((A+B)/C) of a sum of the weight (A) of the first particle and the weight (B) of the second particle relative to a weight (C) of the binder, of which the refractive index is 1.7 or more, is 1 or more and also less than 2.

12. The substrate according to claim 1, further comprising: an electrode layer formed on the top of the high refractive layer.

13. The substrate according to claim 12, wherein a projected area of a high refractive layer is smaller than that of the electrode layer, and the electrode layer is formed on both of the top of the high refractive layer and the top of the base layer on which the high refractive layer is not formed.

14. An organic electronic device, comprising:
the substrate of claim 1; and a first electrode layer; an organic layer comprising an emitting layer; and a second electrode layer which are sequentially present on the substrate.

15. The organic electronic device according to claim 14, wherein the organic layer comprises an emitting layer.

16. The organic electronic device according to claim 14, wherein a projected area of a high refractive layer of the substrate is smaller than that of the first electrode layer, and the first electrode layer is formed on both of the top of the high refractive layer and the top of the base layer on which the high refractive layer is not formed.

17. Lighting, comprising: the organic electronic device of claim 14.

* * * * *